(12) United States Patent
Kalogerakis et al.

(10) Patent No.: US 10,361,687 B2
(45) Date of Patent: *Jul. 23, 2019

(54) MULTI-RATE CLOCK BUFFER

(71) Applicant: FINISAR CORPORATION, Sunnyvale, CA (US)

(72) Inventors: Georgios Kalogerakis, Mountain View, CA (US); The'linh Nguyen, San Jose, CA (US); Timothy G. Moran, San Jose, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/847,842

(22) Filed: Dec. 19, 2017

(65) Prior Publication Data

US 2018/0183416 A1    Jun. 28, 2018

Related U.S. Application Data

(63) Continuation of application No. 14/330,987, filed on Jul. 14, 2014, now Pat. No. 9,847,776.

(51) Int. Cl.

| | |
|---|---|
| *G01F 1/10* | (2006.01) |
| *G01F 1/58* | (2006.01) |
| *G01F 1/60* | (2006.01) |
| *G06F 1/10* | (2006.01) |
| *H03K 5/00* | (2006.01) |
| *H03K 5/02* | (2006.01) |
| *H04L 7/00* | (2006.01) |
| *H04L 7/04* | (2006.01) |
| *G01F 15/06* | (2006.01) |
| *G01F 25/00* | (2006.01) |

(52) U.S. Cl.
CPC ........... *H03K 5/00006* (2013.01); *G06F 1/10* (2013.01); *H03K 5/02* (2013.01); *H04L 7/0016* (2013.01); *H04L 7/0087* (2013.01); *H04L 7/04* (2013.01); *G01F 1/10* (2013.01); *G01F 1/584* (2013.01); *G01F 1/588* (2013.01); *G01F 1/60* (2013.01); *G01F 15/06* (2013.01); *G01F 25/0007* (2013.01)

(58) Field of Classification Search
CPC . G06F 1/10; G01F 15/06; G01F 1/584; G01F 1/588; G01F 1/60; G01F 25/0007; G01F 1/10; H03K 5/00006; H03K 5/02; H04L 7/0016; H04L 7/0087; H04L 7/04
See application file for complete search history.

(56) References Cited

U.S. PATENT DOCUMENTS 9,847,776 B2 * 12/2017 Kalogerakis ....... H03K 5/00006

* cited by examiner

*Primary Examiner* — Terrell S Johnson
(74) *Attorney, Agent, or Firm* — Maschoff Brennan

(57) ABSTRACT

A system may include a driver circuit configured to receive a clock signal. The system may also include a first tuned circuit and a second tuned circuit. The first tuned circuit and the driver circuit may be collectively tuned according to a first frequency range. The first tuned circuit may be configured to be active when a rate of the clock signal is within the first frequency range and to be inactive when the rate is outside of the first frequency range. Further, the second tuned circuit and the driver circuit may be collectively tuned according to a second frequency range that is different from the first frequency range. The second tuned circuit may be configured to be active when the rate is within the second frequency range and to be inactive when the rate is outside of the second frequency range.

20 Claims, 4 Drawing Sheets

MULTI-RATE CLOCK BUFFER

CROSS-REFERENCE TO RELATED APPLICATIONS

This application is a Continuation of U.S. patent application Ser. No. 14/330,987, filed Jul. 14, 2014, titled MULTI-RATE CLOCK BUFFER, which is incorporated herein by reference in its entirety.

FIELD

The embodiments discussed herein are related a multi-rate clock buffer.

BACKGROUND

Electronic systems often include a clock buffer that may be used in a variety of applications such as with clock and data recovery circuits or serializers and de-serializers (e.g., MUX/DEMUX circuits). The clock buffer may be tuned to a corresponding clock signal frequency to reduce the power consumption of the clock buffer. However, in some instances, the frequency of the clock signal input into the clock buffer may vary.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a circuit may include a driver circuit configured to receive a clock signal and to output a modified clock signal based on the received clock signal and that is configured to drive a load circuit with the modified clock signal. The circuit may also include a first tuned circuit that may be electrically coupled to the driver circuit. The first tuned circuit may include one or more components configured with respect to the driver circuit and the load circuit such that the first tuned circuit and the driver circuit are collectively tuned according to a first frequency range. The first tuned circuit may also be configured to be active when a rate of the clock signal is within the first frequency range and may be configured to be inactive when the rate of the clock signal is outside of the first frequency range. Further, the circuit may include a second tuned circuit electrically coupled to the driver circuit. The second tuned circuit may include one or more components configured with respect to the driver circuit and the load circuit such that the second tuned circuit and the driver circuit are collectively tuned according to a second frequency range that is different from the first frequency range. The second tuned circuit may be configured to be active when the rate of the clock signal is within the second frequency range and may be configured to be inactive when the rate of the clock signal is outside of the second frequency range.

The object and advantages of the embodiments will be realized and achieved at least by the elements, features, and combinations particularly pointed out in the claims.

It is to be understood that both the foregoing general description and the following detailed description are exemplary and explanatory and are not restrictive of the present disclosure, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Clock buffers are commonly used to receive a clock signal as an input and to output a modified (e.g., amplified) clock signal that is based on the received clock signal. Often, clock buffers are tuned according to the frequency of the clock signal that may be received. The tuning may improve the performance of the clock buffers such as by reducing power consumption. However, clock buffers may be used in situations where a clock signal that may be received by the clock buffers may have more than one frequency. In these instances, a clock buffer that is tuned for a specific frequency may have reduced performance when a rate of the received clock signal is at a frequency different from the specific frequency. One common work around to this problem is to use a clock buffer that is not tuned and/or to use separate clock buffers for the different frequencies. Both of these solutions may result in increased power consumption and reduced efficiency.

According to at least one embodiment described herein, a circuit that may act as a clock buffer may be configured as a multi-rate clock buffer. The circuit may be configured such that it may be tuned to more than one frequency that may be associated with a corresponding clock signal. Therefore, the circuit may support more than one frequency of the clock signal.

In particular, in some embodiments, the circuit may include a driver configured to drive a load circuit, a first tuned circuit and a second tuned circuit. The first tuned circuit may be electrically coupled to the driver circuit and may include one or more components configured with respect to the driver circuit and the load circuit such that the first tuned circuit and the driver circuit are collectively tuned according to a first frequency range of a corresponding clock signal. The second tuned circuit may also be electrically coupled to the driver circuit and may include one or more components configured with respect to the driver circuit and the load circuit such that the second tuned circuit and the driver circuit are collectively tuned according to a second frequency range of the corresponding clock signal. The second frequency range may be different from the first frequency range.

The first tuned circuit may be configured to be active when a rate of the clock signal is within the first frequency range and may be configured to be inactive when the rate of the clock signal is outside the first frequency range. Additionally, the second tuned circuit may be configured to be active when the rate of the clock signal is within the second frequency range and may be configured to be inactive when the rate of the clock signal is outside of the second frequency range. Therefore, the circuit may be configured as a multi-rate clock buffer that may be tuned to more than one frequency.

Embodiments of the present disclosure will be explained with reference to the accompanying drawings.

Figure 1A:
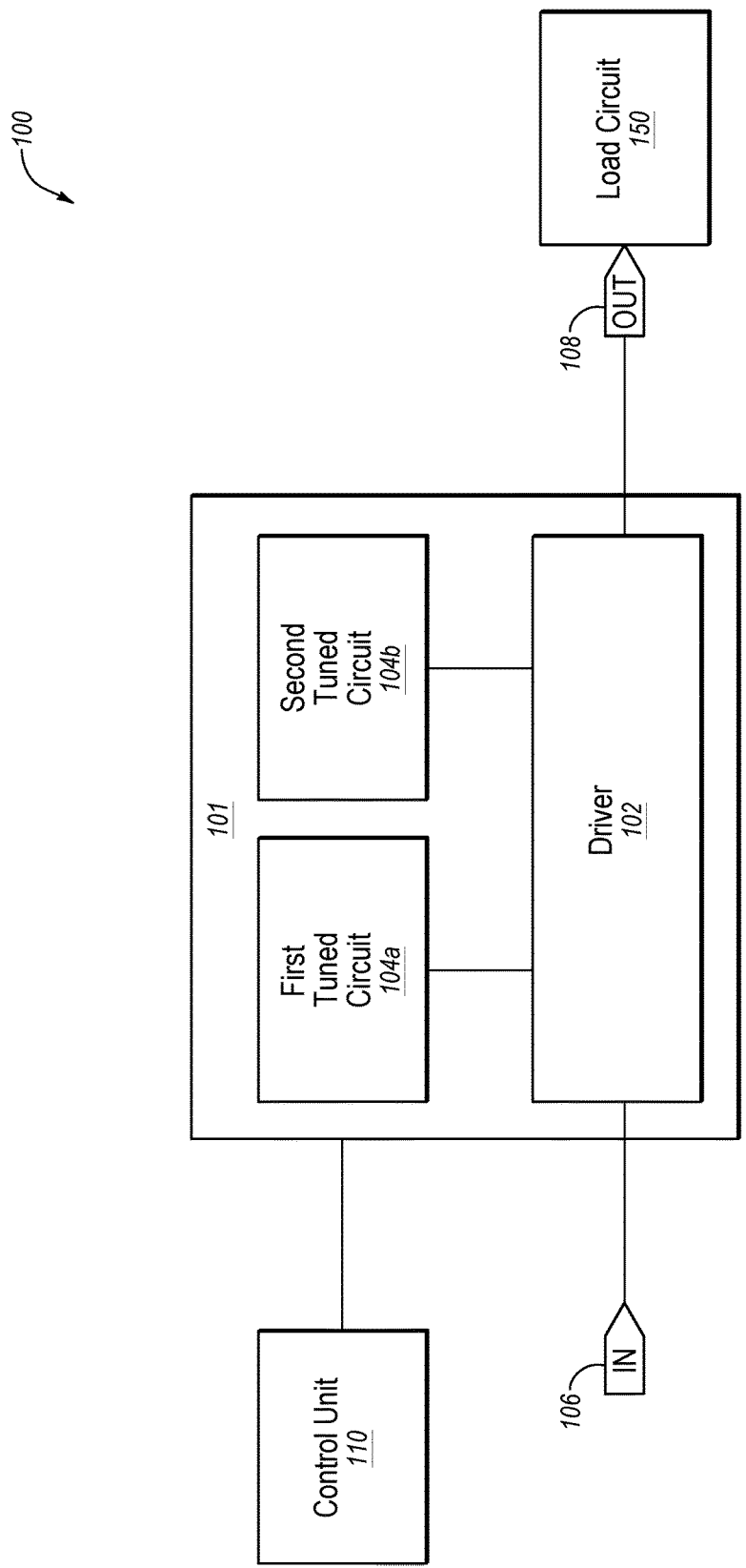
FIG. 1A illustrates an example system that may include a circuit configured as a multi-rate clock buffer.

FIG. 1A illustrates an example system 100 that may include a circuit 101 configured as a multi-rate clock buffer (referred to hereinafter as the "buffer 101"), arranged in accordance with at least one embodiment described herein. The buffer 101 may be implemented with respect to any suitable system or device. For example, the buffer 101 may be implemented with respect to a phase-locked loop circuit, a clock signal and data recovery circuit, a serializer/deserializer circuit, etc.

The buffer 101 may include an input terminal 106 and an output terminal 108. The buffer 101 may be configured to receive a clock signal at the input terminal 106, to generate a modified (e.g., amplified) clock signal that is based on the clock signal received at the input terminal 106, and to output the modified clock signal at the output terminal 108. The buffer 101 may be configured such that the modified clock signal that is output at the output terminal 108 may drive a load circuit 150.

The clock signal that may be received at the input terminal 106 may be driven at different rates at different times depending on the current activity of a corresponding circuit with which the buffer 101 may be associated. For example, in some applications, the rate of the clock signal may be within one of approximately 25 to 30 gigahertz (referred to hereinafter as the "28 GHz range"), 19 to 23 GHz (referred to hereinafter as the "20 GHz range"), or half-rates of the 28 GHz and the 20 GHz ranges—e.g., 13-15 GHz (referred to hereinafter as the "14 GHz range") or a 9 to 12 GHz (referred to hereinafter as the "10 GHz range"), respectively.

Further, in some embodiments, the clock signal may be a differential signal that may include a first clock signal (e.g., a positive clock signal) and a second clock signal (e.g., a negative clock signal). In some of these embodiments, the modified clock signal may also be a differential signal that may include a first modified clock signal (e.g., a positive modified clock signal) and a second modified clock signal (e.g., a negative modified clock signal).

In some embodiments, the buffer 101 may include a driver circuit 102 (referred to hereinafter as the "driver 102"), a first tuned circuit 104a and a second tuned circuit 104b. The first tuned circuit 104a may be electrically coupled to the driver 102 and may include one or more components configured with respect to the driver 102 and the load circuit 150 such that the first tuned circuit 104a and the driver 102 are collectively tuned according to the first frequency range of the clock signal.

The second tuned circuit 104b may also be electrically coupled to the driver 102 and may include one or more components configured with respect to the driver 102 and the load circuit 150 such that the second tuned circuit 104b and the driver 102 are collectively tuned according to a second frequency range of the clock signal. The second frequency range may be different from the first frequency range.

For example, in some embodiments, the first frequency range may include or exclusively be the 28 GHz range and the second frequency range may include or exclusively be the 20 GHz range. In other embodiments, the first frequency range may include or exclusively be the 28 GHz range and the second frequency range may include or exclusively be the 14 GHz range such that the second frequency range may include or exclusively be a half-rate range of the first frequency range. Alternatively, the first frequency range may include or exclusively be the 20 GHz range and the second frequency range may include or exclusively be the 14 GHz range. In other embodiments, the first frequency range may include or exclusively be the 20 GHz range and the second frequency range may include or exclusively be the 10 GHz range such that the second frequency range may be a half-rate range of the first frequency range. Further, in some embodiments, the first frequency range may include or exclusively be the 28 GHz range or the 20 GHz range and the second frequency range may include or exclusively be both the 14 GHz and the 10 GHz ranges.

The first tuned circuit 104a may be configured to be active when the rate of the clock signal is within the first frequency range. The first tuned circuit 104a may also be configured to be inactive when the rate of the clock signal is outside of the first frequency range—e.g., when the rate of the clock signal is within the second frequency range. Additionally, the second tuned circuit 104b may be configured to be active when the rate of the clock signal is within the second frequency range. The second tuned circuit 104b may also be configured to be inactive when the rate of the clock signal is outside of the second frequency range—e.g., when the rate of the clock signal is within the first frequency range. Therefore, the buffer 101 may be tuned for more than one clock signal frequency such that the buffer 101 may be configured as a multi-rate clock buffer that may be tuned to more than one frequency, but in a manner where the tuning for a particular frequency may not substantially interfere with the performance of the buffer 101 when the rate of the clock signal is at another frequency.

The system 100 may also include a control unit 110 that may be electrically coupled to the first tuned circuit 104a and the second tuned circuit 104b. In some embodiments, the control unit 110 may be configured to set the first tuned circuit 104a as active when the rate of the clock signal is within the first frequency range and to set the first tuned circuit 104a as inactive when the rate of the clock signal is outside of the first frequency range. Similarly, the control unit 110 may be configured to set the second tuned circuit 104b as active when the rate of the clock signal is within the second frequency range and to set the second tuned circuit 104b as inactive when the rate of the clock signal is outside of the second frequency range.

In some embodiments, the control unit 110 may be configured to communicate a first control signal to the first tuned circuit 104a and to communicate a second control signal to the second tuned circuit 104b. The first control signal may be configured to set the first tuned circuit 104a as active or inactive based and the second control signal may be configured to set the second tuned circuit 104b as active or inactive.

In these or other embodiments, the control unit 110 may be configured to determine the frequency of the clock signal and may communicate the first and second control signals according to the determined frequency. The control unit 110 may be configured to determine the frequency of the clock signal via any suitable system, apparatus, mechanism, or device. For example, in some embodiments, the control unit 110 may receive an external signal that may indicate what the desired clock rate may be.

In some embodiments, the control unit 110 may include one or more microprocessors, microcontrollers, digital signal processors (DSP), application-specific integrated circuits (ASIC), a Field-Programmable Gate Array (FPGA), or any other digital or analog circuitry configured to interpret and/or to execute program instructions and/or to process data. In some embodiments, the program instructions and/or process data may be stored in memory. In these or other embodiments, the program instructions may be hard wired in the control unit 110.

The memory may include any suitable computer-readable media configured to retain program instructions and/or data for a period of time. By way of example, and not limitation, such computer-readable media may include tangible, non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by the processor. Combinations of the above may also be included within the scope of computer-readable media. Computer-executable instructions may include, for example, instructions and data that cause a general purpose computer, special purpose computer, or special purpose processing device (e.g., a processor) to perform a certain function or group of functions.

Figure 1B:
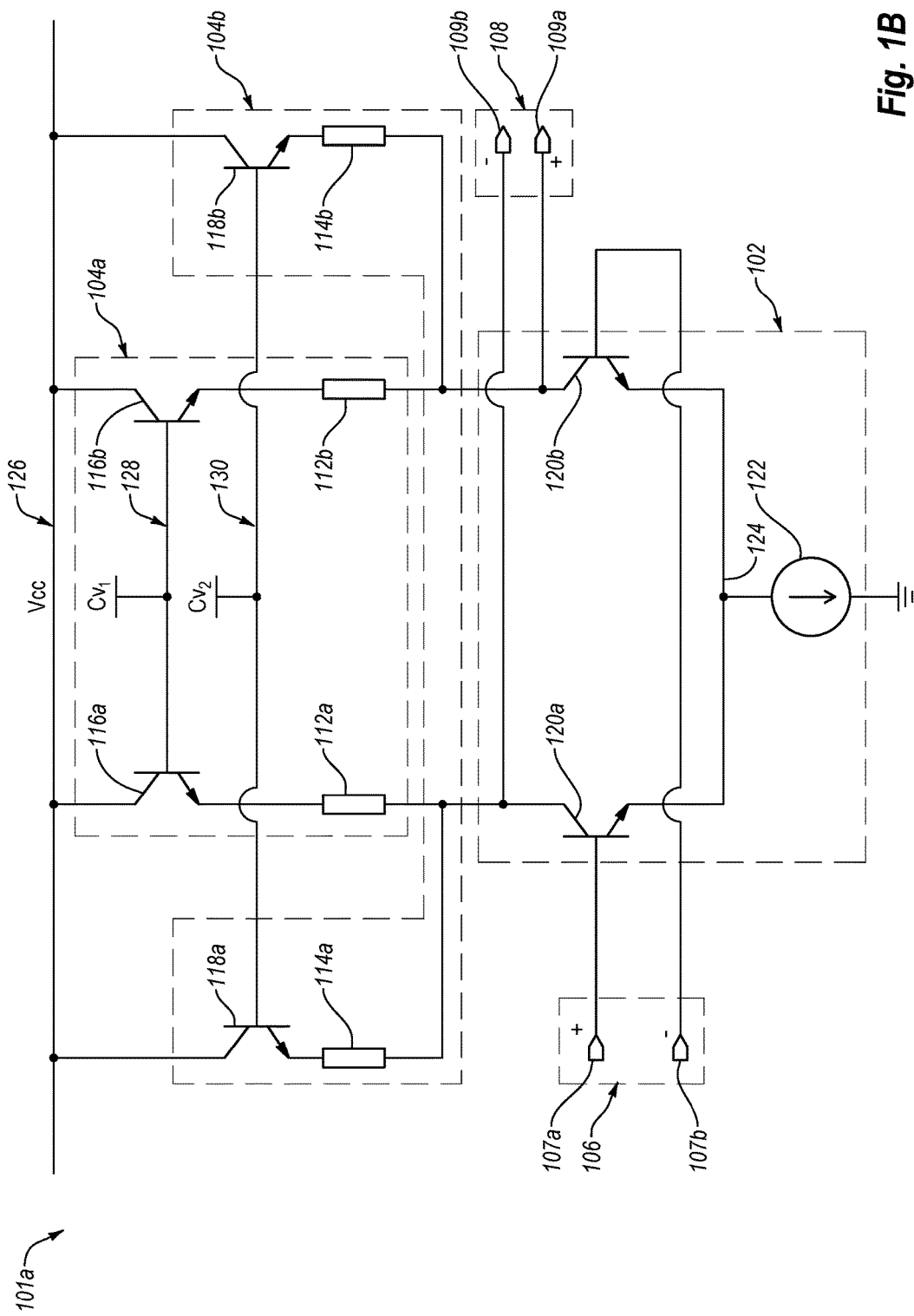
FIG. 1B illustrates an example implementation of the multi-rate clock buffer of FIG. 1A.

FIG. 1B illustrates an example implementation of the buffer 101, according to at least one embodiment described herein. As detailed below, the buffer 101 may include transistors that are depicted and described as bi-polar junction transistors (BJTs). As such, each of the transistors described below may include a base terminal, a collector terminal, and an emitter terminal. As illustrated in FIG. 1B, the emitter terminal may be the terminal with the arrow, the base terminal may be the terminal that is horizontal and perpendicular to the vertical line of the corresponding transistor, and the collector terminal may be the other terminal.

Although the transistors in FIG. 1B are illustrated and described as NPN BJTs, other transistor types may be used. For example, in some instances PNP BJTs may be used instead of NPN BJTs if applicable. In these or other embodiments, one or more other transistors such as metal-oxide-semiconductor field-effect transistor (MOSFET) transistors, junction gate field-effect transistors (JFET), or insulated gate bipolar transistors may be used where applicable.

Further, as the transistors in FIG. B are illustrated as BJTs, the corresponding description uses the nomenclature "base," "collector," and "emitter" to represent different terminals of the transistors. However, the use of the terms "base," "collector," and "emitter" may be used to generically describe analogous terminals of other transistor types.

In the illustrated embodiment of FIG. 1B, the clock signal and the modified clock signal may be differential signals. As such, the input terminal 106 of the driver 102 may include a positive input terminal 107a and a negative input terminal 107b. The positive input terminal 107a may be configured to receive a positive clock signal of the differential clock signal and the negative input terminal 107b may be configured to receive a negative clock signal of the differential clock signal. Additionally, the output terminal 108 of the driver 102 may include a positive output terminal 109a and a negative output terminal 109b. The positive output terminal 109a may be configured to output a positive modified clock signal of the differential modified clock signal and the negative output terminal 109b may be configured to output a negative modified clock signal of the differential modified clock signal.

The driver 102 may also include a first transistor 120a and a second transistor 120b. The base terminal of the first transistor 120a may be electrically coupled to the positive input terminal 107a and the base terminal of the second transistor 120b may be electrically coupled to the negative input terminal 107b. As such, the differential clock signal that may be received at the input terminal 106 may drive the transistors 120.

Additionally, the collector of the first transistor 120a may be electrically coupled to the negative output terminal 109b as illustrated in FIG. 1B. Further, the collector of the second transistor 120b may be electrically coupled to the positive output terminal 109a as illustrated in FIG. 1B. Moreover, the emitters of both the transistors 120 may be electrically coupled to a current-source node 124. In addition, the driver 102 may include a current source 122 that may be electrically coupled between the current-source node 124 and ground.

Based on the illustrated configuration of the driver 102, when the first transistor 120a is active and conducting (e.g., when the positive clock signal is HIGH), the voltage at the negative output terminal 109b may correspond to the negative modified clock signal being LOW. Further, when the first transistor 120a is inactive and non-conducting (e.g., when the positive clock signal is LOW), the voltage at the negative output terminal 109b may correspond to the negative modified clock signal being HIGH. Moreover, when the second transistor 120b is active and conducting (e.g., when the negative clock signal is HIGH), the voltage at the positive output terminal 109a may correspond to the positive modified clock signal being LOW. Further, when the second transistor 120b is inactive and non-conducting (e.g., when the negative clock signal is LOW), the voltage at the positive output terminal 109a may correspond to the positive modified clock signal being HIGH. Therefore, the driver 102 may be configured such that the modified clock signal output at the output terminal 108 may be based on the clock signal that may be received at the input terminal 106.

The first tuned circuit 104a may include a first transistor 116a, a second transistor 116b, a first tuning element 112a, and a second tuning element 112b. The collectors of the transistors 116 may be electrically coupled to a supply node 126 that may have a supply voltage Vcc. The bases of the transistors 116 may be electrically coupled to a first control node 128, which may have a first control voltage $Cv_1$. Further, the first tuning element 112a may be electrically coupled between the emitter of the first transistor 116a and the negative output terminal 109b. Moreover, the second tuning element 112b may be electrically coupled between the emitter of the second transistor 116b and the positive output terminal 109a.

Based on the illustrated configuration of the first tuned circuit 104a, when the first control voltage $Cv_1$ is set HIGH, the transistors 116 may be conducting and active such that the first tuned circuit 104a may be active. Conversely, when the first control voltage $Cv_1$ is set LOW, the transistors 116 may not be conducting and may be inactive such that the first tuned circuit 104a may be inactive. Therefore, in some embodiments, the control unit 110 (not illustrated in FIG. 1B) may set the first control voltage $Cv_1$ HIGH to set the first tuned circuit 104a as active and may set the first control voltage $Cv_1$ LOW to set the first tuned circuit 104a as inactive. As detailed above, the control unit 110 may set the first tuned circuit 104a as active when the rate of the clock signal received at the input terminal 106 is within the first frequency range. And, the control unit 110 may set the first tuned circuit 104a as inactive when the rate of the clock signal is outside of the first frequency range.

The tuning elements 112 may be configured with respect to the current source 122 and the load circuit 150 (not expressly illustrated in FIG. 1B) such that the first tuned circuit 104a and the driver 102 are collectively tuned according to the first frequency range. For example, in some embodiments, the current source 122 may be configured to source a particular amount of current and the tuning elements 112 may be inductors. The inductance of the tuning elements 112 may be selected based on the particular current such that the first tuned circuit 104a and the driver 102 are collectively tuned according to the first frequency range when the particular current from the current source is running through the transistors 116, the tuning elements 112, and the transistors 120 (e.g., when the first tuned circuit 104a is active). In these or other embodiments, the current of the current source 122 may also be modified to tune the first tuned circuit 104a and the driver 102 according to the first frequency range. The selection of the inductance and/or the particular current to achieve the desired tuning may be performed according to any suitable methodology. Additionally, the choice of the current may be based on the current demand of the load circuit 150 such that the tuning may also be based on the load circuit 150.

In some embodiments, one or more of the tuning elements 112 may be resistors instead of inductors, and the corresponding resistance may be selected with respect to the particular current such that the first tuned circuit 104a and the driver 102 may be collectively tuned according to the first frequency range. The selection of the resistance and/or the particular current to achieve the desired tuning may be performed according to any suitable methodology.

The second tuned circuit 104b may include a first transistor 118a, a second transistor 118b, a first tuning element 114a, and a second tuning element 114b. The collectors of the transistors 118 may be electrically coupled to the supply node 126. The bases of the transistors 118 may be electrically coupled to a second control node 130, which may have a second control voltage $Cv_2$. Further, the first tuning element 114a may be electrically coupled between the emitter of the first transistor 118a and the negative output terminal 109b. Moreover, the second tuning element 114b may be electrically coupled between the emitter of the second transistor 118b and the positive output terminal 109a.

Based on the illustrated configuration of the second tuned circuit 104b, when the second control voltage $Cv_2$ is set HIGH, the transistors 118 may be conducting and active such that the second tuned circuit 104b may be active. Conversely, when the second control voltage $Cv_2$ is set LOW, the transistors 118 may not be conducting and may be inactive such that the second tuned circuit 104b may be inactive. Therefore, in some embodiments, the control unit 110 (not illustrated in FIG. 1B) may set the second control voltage $Cv_2$ HIGH to set the second tuned circuit 104b as active and may set the second control voltage $Cv_2$ LOW to set the second tuned circuit 104b as inactive. As detailed above, the control unit 110 may set the second tuned circuit 104b as active when the rate of the clock signal received at the input terminal 106 is within the second frequency range. And, the control unit 110 may set the second tuned circuit 104b as inactive when the rate of the clock signal is outside of the second frequency range.

The tuning elements 114 may be configured with respect to the current source 122 and the load circuit 150 such that the second tuned circuit 104b and the driver 102 are collectively tuned according to the second frequency range. For example, in some embodiments, the current source 122 may be configured to source a particular amount of current and the tuning elements 114 may be inductors or resistors. The inductance or resistance of the tuning elements 114 may be selected based on the particular current such that the second tuned circuit 104b and the driver 102 are collectively tuned according to the second frequency range when the particular current from the current source is running through the transistors 118, the tuning elements 114, and the transistors 120 (e.g., when the second tuned circuit 104b is active). In these or other embodiments, the current of the current source 122 may also be modified to tune the second tuned circuit 104b and the driver 102 according to the second frequency range. The selection of the inductance, the resistance, and/or the particular current to achieve the desired tuning may be performed according to any suitable methodology.

Therefore, the buffer 101 may be configured as a multi-rate clock buffer that may be tuned according to more than one clock signal frequency. Modifications, additions, or omissions may be made to the system 100 without departing from the scope of the present disclosure. For example, the illustrated implementation depicts specific component types such as BJTs for the transistors. However, different component types may be used.

Figure 2:
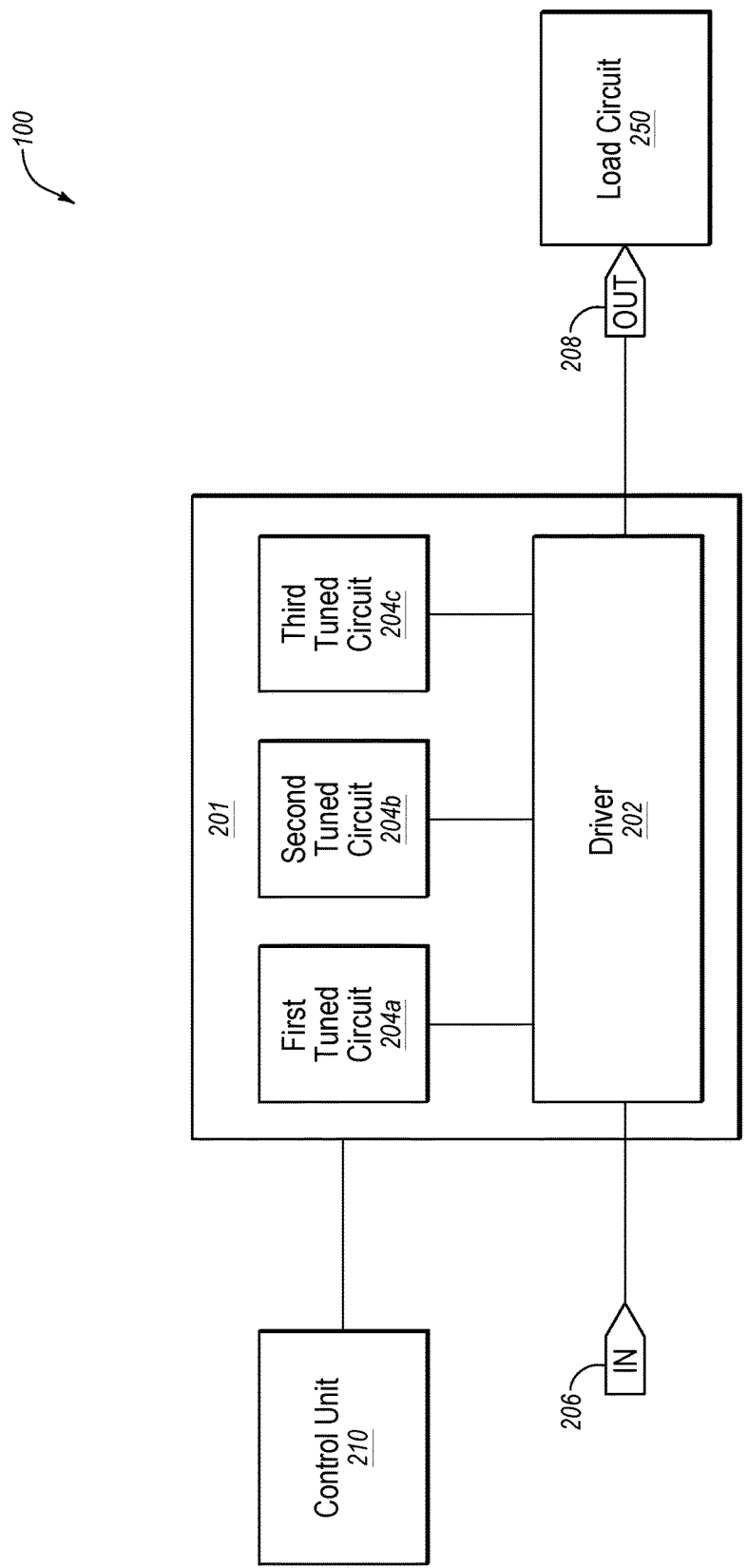
FIG. 2 illustrates another example embodiment of a system that includes a circuit configured as a multi-rate clock buffer.

Additionally, the number of tuned circuits included in a multi-rate clock buffer may vary. For example, FIG. 2 illustrates an example embodiment of a system 200 that includes a circuit 201 configured as a multi-rate clock buffer (referred to hereinafter as the "buffer 201") that may include a third tuned circuit 204c in addition to a first tuned circuit 204a and a second tuned circuit 204b, according to at least one embodiment described herein. The system 200 may also include a control unit 210 and the buffer 201 may include a driver circuit 202 (referred to hereinafter as the "driver 202"), an input terminal 206 and an output terminal 208 communicatively coupled to a load circuit 250. The control unit 210, the driver 202, the first tuned circuit 204a, the second tuned circuit 204b, and the load circuit 250 may be analogous to the control unit 110, the driver 102, the first tuned circuit 104a, and the second tuned circuit 104b, respectively, of FIG. 1A and/or FIG. 1B.

Therefore, the first tuned circuit 204a may be electrically coupled to the driver 202 and may include one or more components configured with respect to the driver 202 and the load circuit 250 such that the first tuned circuit 204a and the driver 202 are collectively tuned according to a first frequency range. Additionally, the first tuned circuit 204a may be configured to be active (e.g., via a first control signal from the control unit 210) when the rate of a clock signal that may be received at the input terminal 206 is within the first frequency range and may be configured to be inactive (e.g., via the first control signal from the control unit 210) when the rate of the clock signal is outside of the first frequency range.

Similarly, the second tuned circuit 204b may be electrically coupled to the driver 202 and may include one or more components configured with respect to the driver 202 and the load circuit 250 such that the second tuned circuit 204b and the driver 202 are collectively tuned according to the second frequency range of the clock signal. Additionally, the second tuned circuit 204b may be configured to be active (e.g., via a second control signal from the control unit 210) when the rate of the clock signal is within the second frequency range and may be configured to be inactive (e.g., via the second control signal from the control unit 210) when the rate of the clock signal is outside of the second frequency range.

Further, the third tuned circuit 204c may be electrically coupled to the driver 202 and may include one or more components configured with respect to the driver 202 and the load circuit 250 such that the third tuned circuit 204c and the driver 202 may be collectively tuned according to a third frequency range of the clock signal. The third frequency range of may be different from the first frequency range and the second frequency range. For example, in some embodiments, the first frequency range may include or exclusively be the 28 GHz range, the second frequency range may include or exclusively be the 20 GHz range, and the third frequency range may include or exclusively be the 10 GHz range and/or the 14 GHz range.

The third tuned circuit 204c may be configured to be active when the rate of the clock signal is within the third frequency range. The third tuned circuit 204c may also be configured to be inactive when the rate of the clock signal is outside of the third frequency range—e.g., when the rate of the clock signal is within the first frequency range or within the second frequency range. Additionally, the first tuned circuit 204a and the second tuned circuit 204b may be configured to be inactive when the rate of the clock signal is within the third frequency range. In some embodiments, the control unit 210 may be configured to set the third tuned circuit 204c as active or inactive based on a third control signal.

In some embodiments, the driver 202, the first tuned circuit 204a, and the second tuned circuit 204b may be configured such as the driver 102, the first tuned circuit 104a, and the second tuned circuit 104b, as illustrated in FIG. 1B. In some of these embodiments, the third tuned circuit 204c may include transistors and tuning elements configured in a similar manner with respect to the driver 202, the input terminal 206, and the output terminal 208.

For example, the third tuned circuit 204c may include transistors configured to be turned on and active when the rate of the clock signal is within the third frequency range and configured to be turned off when the rate of the clock signal is outside of the third frequency range. Further, the third tuned circuit 204c may include one or more tuning elements (e.g., inductors and/or resistors) configured with respect to one or more components of the driver 202 (e.g., with a current source of the driver 202) and the load circuit 250 such that the third tuned circuit 204c and the driver 202 are collectively tuned according to the third frequency range.

Figure 3:
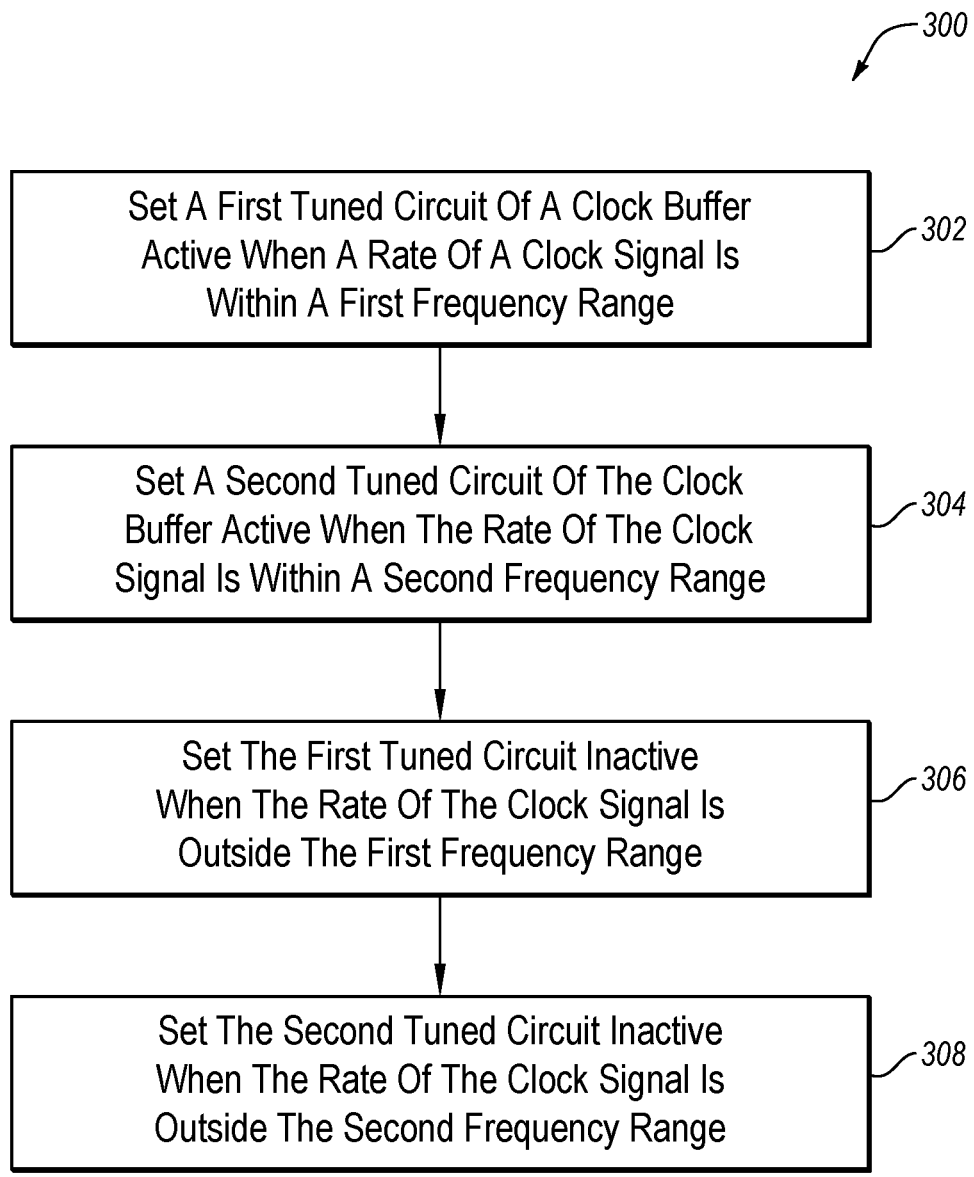
FIG. 3 is a flowchart of an example method for controlling a multi-rate clock buffer.

FIG. 3 is a flowchart of an example method 300 for controlling a multi-rate clock buffer, arranged in accordance with at least one embodiment described herein. The method 300 may be implemented, in some embodiments, by a control unit, such as the control units 110 and 210 of FIGS. 1A and 2, respectively. Although illustrated as discrete blocks, various blocks of method 300 may be divided into additional blocks, combined into fewer blocks, or eliminated, depending on the desired implementation.

The method 300 may begin, and at block 302, a first tuned circuit of a clock buffer may be set as active when a rate of a clock signal received at the clock buffer is within a first frequency range. As indicated above, the first tuned circuit may include one or more components that are configured with respect to a driver circuit of the clock buffer and a load circuit that may be driven by the driver circuit such that the first tuned circuit and the driver circuit are collectively tuned according to the first frequency range. In some embodiments, the first tuned circuit may be set active based on a control signal that may turn on one or more transistors of the first tuned circuit such that the one or more transistors are conducting and active. In some embodiments, the first frequency range may include or exclusively be the 28 GHz range, the 20 GHz range, the 14 GHz range, or the 10 GHz range. In some embodiments, the first frequency range may include both the 14 GHz range and the 10 GHz range.

At block 304, a second tuned circuit of the clock buffer may be set as active when the rate of the clock signal is within a second frequency range that is different from the first frequency range. As indicated above, the second tuned circuit may include one or more components that are configured with respect to the driver circuit of the clock buffer and the load circuit such that the second tuned circuit and the driver circuit are collectively tuned according to the second frequency range. In some embodiments, the second tuned circuit may be set active based on a control signal that may turn on one or more transistors of the second tuned circuit such that the one or more transistors are conducting and active. In some embodiments, the second frequency range may include or exclusively be the 28 GHz range, the 20 GHz range, the 14 GHz range, or the 10 GHz range. In some embodiments, the second frequency range may include both the 14 GHz range and the 10 GHz range.

At block 306, the first tuned circuit may be set as inactive when the rate of the clock signal is outside of the first frequency range. In some embodiments, the first tuned circuit may be set inactive based on a control signal that may turn off one or more transistors of the first tuned circuit such that the one or more transistors are not conducting and are inactive.

At block 308, the second tuned circuit may be set as inactive when the rate of the clock signal is outside of the second frequency range. In some embodiments, the second tuned circuit may be set inactive based on a control signal that may turn off one or more transistors of the second tuned circuit such that the one or more transistors are not conducting and are inactive.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, in some embodiments, the method 300 may include additional steps associated with setting a third tuned circuit of the clock buffer as active when the rate of the clock signal is within a third frequency range and setting the third tuned circuit as inactive when the rate of the clock signal is outside of the third frequency range. In some embodiments, the third tuned circuit may be set as active by turning one or more transistors of the third tuned circuit on and setting the third tuned circuit as inactive may be done by turning the one or more transistors off. Further, the third tuned circuit may include one or more components configured with respect to the driver circuit of the clock buffer and the load circuit such that the third tuned circuit and the driver circuit are collectively tuned according to the third frequency range.

The embodiments described herein may include the use of a special-purpose or general-purpose computer including various computer hardware or software modules, as discussed in greater detail below.

Embodiments described herein may include computer-readable media for carrying or having computer-executable instructions or data structures stored thereon. As mentioned above with respect to the control unit, such computer-readable media may be any available media that may be accessed by a general-purpose or special-purpose computer. Additionally, computer-executable instructions may include, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the terms "module," "component," or "unit" may refer to specific hardware implementations configured to perform the operations of the module or component and/or software objects or software routines that may be stored on and/or executed by general-purpose hardware (e.g., computer-readable media, processing devices, etc.) of the computing system. In some embodiments, the different components, modules, engines, and services described herein may be implemented as objects or processes that execute on the computing system (e.g., as separate threads). While some of the system and methods described herein are generally described as being implemented in software (stored on and/or executed by general purpose hardware), specific hardware implementations or a combination of software and specific hardware implementations are also possible and contemplated. In this description, a "computing entity" may be any computing system as previously defined herein, or any module or combination of modules running on a computing system.

All examples and conditional language recited herein are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A circuit comprising:
   a first tuned circuit electrically coupled to a driver circuit and configured such that the first tuned circuit and the driver circuit are collectively tuned according to a first frequency range, the first tuned circuit configured to be active when a rate of a clock signal is within the first frequency range and configured to be inactive when the rate of the clock signal is outside of the first frequency range, wherein the first tuned circuit includes:
      a first tuning element electrically coupled to an output of the driver circuit, wherein the output is configured to output a modified clock signal; and
      a first switch circuit electrically coupled between the first tuning element and a supply voltage, the first switch circuit being configured to receive a first control signal that is configured to activate the first switch circuit when the rate of the clock signal is within the first frequency range and to deactivate the first switch circuit when the rate of the clock signal is outside of the first frequency range; and
   a second tuned circuit electrically coupled to the driver circuit and configured such that the second tuned circuit and the driver circuit are collectively tuned according to a second frequency range that is different from the first frequency range, the second tuned circuit configured to be active when the rate of the clock signal is within the second frequency range and configured to be inactive when the rate of the clock signal is outside of the second frequency range, wherein the second tuned circuit includes:
      a second tuning element electrically coupled to the output; and
      a second switch circuit electrically coupled between the second tuning element and the supply voltage, the second switch circuit being configured to receive a second control signal that is configured to activate the second switch circuit when the rate of the clock signal is within the second frequency range and to deactivate the second switch circuit when the rate of the clock signal is outside of the second frequency range.

2. The circuit of claim 1, wherein the driver circuit is configured to receive the clock signal and to output the modified clock signal based on the received clock signal, the modified clock signal being configured to drive a load circuit.

3. The circuit of claim 1, the first tuning element comprising a resistor or an inductor.

4. The circuit of claim 1, wherein the first switch circuit is electrically coupled between the first tuning element and the supply voltage without another tuning element being coupled between the first switch circuit and the supply voltage.

5. The circuit of claim 1, wherein:
   the clock signal is a differential clock signal that includes a first clock signal and a second clock signal;
   the modified clock signal is a differential signal that includes a first modified clock signal and a second modified clock signal; and
   the output of the driver circuit includes a first output configured to output the first modified clock signal and a second output configured to output the second modified clock signal.

6. The circuit of claim 1, wherein:
   the first tuned circuit includes one or more first tuning elements configured with respect to a current source and a load circuit such that the first tuned circuit and the driver circuit are collectively tuned according to the first frequency range; and
   the second tuned circuit includes one or more second tuning elements configured with respect to the current source and the load circuit such that the second tuned circuit and the driver circuit are collectively tuned according to the second frequency range.

7. The circuit of claim 6, wherein the one or more first tuning elements and the one or more second tuning elements include one or more of a resistor and an inductor.

8. The circuit of claim 1, the first tuned circuit comprising:
   a third tuning element electrically coupled to a first output; and
   a third switch circuit electrically coupled between the third tuning element and the supply voltage; and
   the second tuned circuit comprising:
   a fourth tuning element electrically coupled to the first output; and
   a fourth switch circuit electrically coupled between the fourth tuning element and the supply voltage.

9. The circuit of claim 1, further comprising a control unit configured to:
   set the first control signal such that the first tuned circuit is active when the rate of the clock signal is within the first frequency range;

set the second control signal such that the second tuned circuit is inactive when the rate of the clock signal is within the first frequency range;
set the first control signal such that the first tuned circuit is inactive when the rate of the clock signal is within the second frequency range; and
set the second control signal such that the second tuned circuit is active when the rate of the clock signal is within the second frequency range.

10. The circuit of claim 1, further comprising a third tuned circuit electrically coupled to the driver circuit and including one or more components configured with respect to the driver circuit and a load circuit such that the third tuned circuit and the driver circuit are collectively tuned according to a third frequency range that is different from the first frequency range and the second frequency range, the third tuned circuit configured to be active when the rate of the clock signal is within the third frequency range and configured to be inactive when the rate of the clock signal is outside of the third frequency range.

11. A method comprising:
setting, based on a first control signal, a first tuned circuit of a clock buffer as active when a rate of a clock signal received at the clock buffer is within a first frequency range, the first tuned circuit including one or more components configured with respect to a driver circuit of the clock buffer and a load circuit driven by the driver circuit such that the first tuned circuit and the driver circuit are collectively tuned according to the first frequency range wherein the first tuned circuit includes:
a first tuning element electrically coupled to an output of the driver circuit, wherein the output is configured to output a modified clock signal; and
a first switch circuit electrically coupled between the first tuning element and a supply voltage, the first switch circuit being configured to receive a first control signal that is configured to activate the first switch circuit when the rate of the clock signal is within the first frequency range and to deactivate the first switch circuit when the rate of the clock signal is outside of the first frequency range; and
setting, based on a second control signal, a second tuned circuit of the clock buffer as active when the rate of the clock signal received at the clock buffer is within a second frequency range that is different from the first frequency range, the second tuned circuit including one or more components configured with respect to the driver circuit of the clock buffer and the load circuit such that the second tuned circuit and the driver circuit are collectively tuned according to the second frequency range, wherein the second tuned circuit includes:
a second tuning element electrically coupled to the output of the driver circuit; and
a second switch circuit electrically coupled between the second tuning element and the supply voltage, the second switch circuit being configured to receive a second control signal that is configured to activate the second switch circuit when the rate of the clock signal is within the second frequency range and to deactivate the second switch circuit when the rate of the clock signal is outside of the second frequency range.

12. The method of claim 11, further comprising setting, based on the first control signal, the first tuned circuit as inactive when the rate of the clock signal is outside of the first frequency range, wherein the first control signal is configured to deactivate the first switch circuit when the rate of the clock signal is outside of the first frequency range such that the first tuned circuit is inactive.

13. The method of claim 11, further comprising setting the second tuned circuit as inactive when the rate of the clock signal is outside of the second frequency range, wherein the second control signal is configured to deactivate the second switch circuit when the rate of the clock signal is outside of the second frequency range such that the second tuned circuit is inactive.

14. The method of claim 11, wherein the first switch circuit is electrically coupled between the first tuning element and the supply voltage without another tuning element being coupled between the first switch circuit and the supply voltage.

15. The method of claim 11, further comprising setting a third tuned circuit of the clock buffer as active when the rate of the clock signal is within a third frequency range and setting the third tuned circuit as inactive when the rate of the clock signal is outside of the third frequency range.

16. The method of claim 15, the third tuned circuit comprising one or more components configured with respect to the driver circuit of the clock buffer and the load circuit such that the third tuned circuit and the driver circuit are collectively tuned according to the third frequency range.

17. The method of claim 15, further comprising activating the third tuned circuit by activating one or more transistors of the third tuned circuit.

18. The method of claim 15, further comprising deactivating the third tuned circuit by deactivating one or more transistors of the third tuned circuit.

19. A clock buffer comprising:
a first tuned circuit configured according to a first frequency range, wherein the first tuned circuit includes:
a first tuning element electrically coupled to an output of a driver circuit, wherein the output is configured to output a modified clock signal; and
a first switch circuit electrically coupled between the first tuning element and a supply voltage, the first switch circuit being configured to receive a first control signal that is configured to activate the first switch circuit when the rate of the clock signal is within the first frequency range and to deactivate the first switch circuit when the rate of the clock signal is outside of the first frequency range; a second tuned circuit configured according to a second frequency range that is different from the first frequency range; and
a second tuned circuit configured according to a second frequency range that is different from the first frequency range, wherein the second tuned circuit includes:
a second tuning element electrically coupled to the output; and
a second switch circuit electrically coupled between the second tuning element and the supply voltage, the second switch circuit being configured to receive a second control signal that is configured to activate the second switch circuit when the rate of the clock signal is within the second frequency range and to deactivate the second switch circuit when the rate of the clock signal is outside of the second frequency range.

20. The clock buffer of claim 19, further comprising a control unit configured to:

activate the first tuned circuit when the rate of the clock signal is within the first frequency range by turning the first switch circuit on with the first control signal;

deactivate the first tuned circuit when the rate of the clock signal is outside of the first frequency range by turning the first switch circuit off with the first control signal;

activate the second tuned circuit when the rate of the clock signal is within the second frequency range by turning the second switch circuit on with the second control signal; and deactivate the second tuned circuit when the rate of the clock signal is outside of the second frequency range by turning the second switch circuit on with the second control signal.

* * * * *